US012698558B2

(12) United States Patent
Vuille et al.

(10) Patent No.: US 12,698,558 B2
(45) Date of Patent: Aug. 4, 2026

(54) METHOD FOR THE SURFACE TREATMENT OF A JEWEL, IN PARTICULAR FOR THE WATCHMAKING INDUSTRY

(71) Applicant: Comadur SA, Le Locle (CH)

(72) Inventors: Pierry Vuille, Les Emibois (CH); Alexis Boulmay, Morteau (FR)

(73) Assignee: Comadur SA, Le Locle (CH)

( * ) Notice: Subject to any disclaimer, the term of this patent is extended or adjusted under 35 U.S.C. 154(b) by 0 days.

(21) Appl. No.: 17/841,892

(22) Filed: Jun. 16, 2022

(65) Prior Publication Data

US 2023/0002882 A1      Jan. 5, 2023

(30) Foreign Application Priority Data

Jul. 2, 2021      (EP) ..................................... 21183556

(51) Int. Cl.
*C23C 14/48* (2006.01)
*C23C 14/06* (2006.01)
*C23C 16/34* (2006.01)
*C23C 16/50* (2006.01)
*C30B 29/20* (2006.01)

(52) U.S. Cl.
CPC .......... *C23C 14/48* (2013.01); *C23C 14/0641* (2013.01); *C23C 16/34* (2013.01); *C23C 16/50* (2013.01); *C30B 29/20* (2013.01)

(58) Field of Classification Search
CPC ..... C23C 14/48; C23C 14/0641; C23C 16/34; C23C 16/50
See application file for complete search history.

(56) References Cited

U.S. PATENT DOCUMENTS

| | | | |
|---|---|---|---|
| 2013/0287955 A1 | 10/2013 | Portet et al. | |
| 2018/0112144 A1 | 4/2018 | Rannoux et al. | |
| 2019/0326088 A1 * | 10/2019 | Boulmay | ................ C30B 29/04 |
| 2019/0352763 A1 | 11/2019 | Vuille et al. | |
| 2021/0189278 A1 | 6/2021 | Huot-Marchand | |

FOREIGN PATENT DOCUMENTS

| | | | |
|---|---|---|---|
| EP | 3 389 078 A1 | 10/2018 | |
| EP | 3 556 911 A1 | 10/2019 | |
| EP | 3 783 445 A1 | 2/2021 | |
| JP | 2003239083 A * | 8/2003 | ............ C23C 28/34 |
| JP | 2014-504920 A | 2/2014 | |
| JP | 2015-518921 A | 7/2015 | |
| JP | 2015144804 A * | 8/2015 | |
| JP | 2017-516737 A | 6/2017 | |
| JP | 2018-69233 A | 5/2018 | |
| JP | 2019-525394 A | 9/2019 | |

(Continued)

OTHER PUBLICATIONS

JP-2003239083-A English translation (Year: 2023).*

(Continued)

*Primary Examiner* — Hai Y Zhang
(74) *Attorney, Agent, or Firm* — Sughrue Mion, PLLC

(57) ABSTRACT

A method for treating a jewel of the monocrystalline or polycrystalline type (20), in particular for the watchmaking industry, the jewel (20) including a body (23) defining the shape thereof. The method includes a step of ion implantation on the surface (24) of at least a part of the body (23) to modify the roughness of the surface (24).

9 Claims, 1 Drawing Sheet

(56) References Cited

FOREIGN PATENT DOCUMENTS

| | | | |
|---|---|---|---|
| JP | 2021-96242 | A | 6/2021 |
| WO | 2013/167624 | A1 | 11/2013 |
| WO | 2015/177334 | A1 | 11/2015 |
| WO | 2018/188804 | A1 | 10/2018 |

OTHER PUBLICATIONS

JP-2015144804-A English translation (Year: 2023).*
Brighton Science, What is contact angle? https://www.brighton-science.com/what-is-contact-angle. (Year: 2022).*
Wetting and contact angle, https://www.teachengineering.org/lessons/view/duk_surfacetensionunit_less3. (Year: 2021).*
JP-2015144804-A English translation (Year: 2015).*
JP-2003239083-A (Year: 2003).*
European Search Report EP 21 18 3556 dated Dec. 6, 2021.

\* cited by examiner

METHOD FOR THE SURFACE TREATMENT OF A JEWEL, IN PARTICULAR FOR THE WATCHMAKING INDUSTRY

CROSS REFERENCE TO RELATED APPLICATION

The present application is based on, and claims priority from the prior European Patent Application No. 21183556.6, filed on Jul. 2, 2021, the entire contents of which are incorporated herein by reference.

TECHNICAL FIELD OF THE INVENTION

The invention relates to a method for the surface treatment of a horological jewel, in particular for the watchmaking industry.

TECHNOLOGICAL BACKGROUND

In the prior art of watchmaking, rotating wheel sets, such as balances, typically include two pivots, the ends whereof are inserted into jewels so that they can rotate. Typically, ruby, $ZrO_2$ or sapphire type jewels are used to form endstones or guide elements referred to as bearings. These endstones and guide elements are intended to come into contact with the pivots to make same capable of moving in rotation with minimal friction. They thus form, for example, all or part of a bearing of the arbor of the wheel set mounted such that it rotates. Jewels used as a rotational guide element for a pivot typically have a through-hole into which the pivot is inserted so as to bear on an endstone.

FIG. 1 is an example from the prior art of an assembly 1 comprising a jewel 2 provided with a hole 3 and a hemispherical recess 4 forming the entrance to the hole 3. The assembly 1 further comprises a pivot 7 configured to be inserted into the hole 3 in order to allow a movable element, not shown in the figure, to rotate.

In principle, synthetic jewels are used in horological movements. In particular, the Verneuil method is known for manufacturing monocrystalline-type jewels. Polycrystalline-type jewels also exist, which are manufactured by pressing a precursor in order to obtain a green body of the future jewel from a pressing tool.

Once formed, the jewels are typically subjected to a method for depositing an epilame on the jewel. The epilame is a thin layer that allows the physical properties of the surface of the jewel to be modified.

The surface finish is important for contact with liquids, in particular for lubricating the jewel, for example with a pivot. More specifically, a drop of liquid deposited on the surface of the jewel forms a contact angle that varies depending on the surface finish. The smaller the angle, the more the drop spreads over the surface, and the larger the angle, the more the drop remains bulging on the surface of the jewel. For example, for an epilame-coated jewel, the angle of a drop of lubricating oil is about 44°, whereas without epilame, the drop forms a smaller angle, and is thus spread further. Typically, spreading of the drop, for improved lubrication, is only desired for example between the jewel and the pivot.

However, the drawback of the epilame layer is that the effect thereof remains limited to an angle of less than 50°, even though it effectively increases the contact angle. On the other hand, the epilame layer wears out over time, as the adhesion of the epilame layer to the jewel is not optimal. As a result, the wear of the epilame layer reduces the adhesion of the lubricating oil.

SUMMARY OF THE INVENTION

The purpose of the invention is to overcome the aforementioned drawbacks, and aims to provide a jewel with a larger contact angle with the lubricating oil, and with a longer life.

To this end, the invention relates to a method for treating a jewel, in particular a horological jewel, the jewel comprising a body defining the shape thereof.

The method is noteworthy in that it comprises a step of ion implantation on the surface of the body to modify the roughness of said surface.

Ion implantation increases or decreases the relief of the surface of the jewel, which changes the roughness thereof. Depending on the size of the implanted ions, a different roughness is obtained, as the ions structure the surface differently. Some ions increase the roughness, whereas other ions decrease the roughness of the surface.

Thus, ion implantation can produce two opposite effects of particular interest depending on the ion chosen for implantation. With some ions, ion implantation allows the contact angle with a liquid to be decreased, whereas with other ions, the contact angle with a liquid increases.

For example, by decreasing the contact angle of the surface, the adhesion of an epilame layer deposited on this ion implanted surface is increased. The life of the epilame layer is thus increased, which wears out less quickly than a layer deposited on a jewel without ion implantation.

On the other hand, by increasing the contact angle of the surface of the jewel, the need for an epilame layer can be dispensed with, and the lubricating oil can be disposed directly on the jewel. This simplifies the jewel manufacturing method, as it avoids the need to deposit an epilame layer, and can even achieve far higher contact angles than those obtained with an epilame layer.

According to one specific embodiment of the invention, the method comprises a step of depositing an epilame layer on the surface of the jewel.

According to one specific embodiment of the invention, the epilame layer comprises chromium nitride, and is preferably made entirely thereof.

According to one specific embodiment of the invention, the step of depositing the epilame layer is carried out by PVD, PECVD.

According to one specific embodiment of the invention, the ions implanted on the surface reduce the contact angle of a drop of liquid, the contact angle being less than 40° for a drop of water.

According to one specific embodiment of the invention, the implanted ions are helium or argon.

According to one specific embodiment of the invention, the ions implanted on the surface of the body increase the contact angle of a drop of liquid, the contact angle being greater than 50°, or even greater than 70°, for a drop of water.

According to one specific embodiment of the invention, the implanted ions are nitrogen.

According to one specific embodiment of the invention, the ion implantation step is carried out by ECR-type magnetic electron cyclotron resonance.

According to one specific embodiment of the invention, the ion implantation step is carried out using plasma.

According to one specific embodiment of the invention, the body of the jewel is previously formed in a first step by a Verneuil-type method for a monocrystalline jewel or by a sintering method for a polycrystalline jewel.

According to one specific embodiment of the invention, the jewel comprises $Al_2O_3$ or $ZrO_2$, and is preferably made entirely thereof.

BRIEF DESCRIPTION OF THE FIGURES

Other specific features and advantages will be clearly observed in the following description, which is given as a rough guide and in no way as a limiting guide, with reference to the accompanying drawings, wherein.

DETAILED DESCRIPTION OF THE INVENTION

Figure 1:
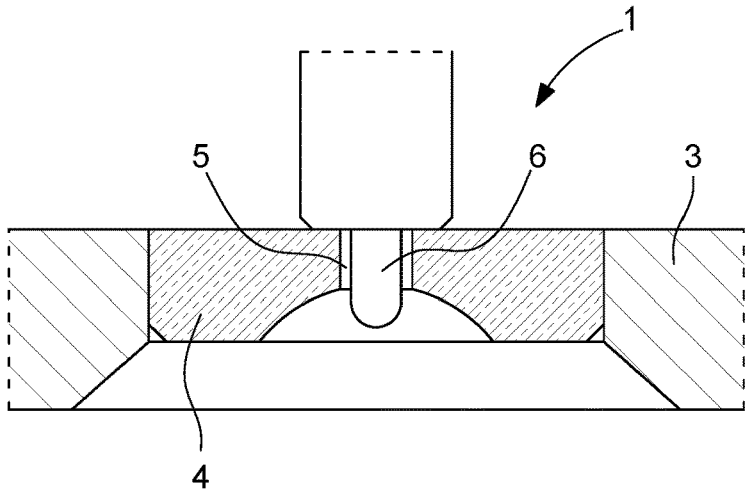
FIG. 1 is a diagrammatic view of a bearing for a pivot according to one known embodiment from the prior art.

As explained hereinabove, the invention relates to a method 10 for the surface treatment of a jewel capable of forming a guide element of a timepiece, as shown in FIG. 1. The jewel is, for example, intended to come into contact with a pivot, also referred to as a trunnion, for example of a balance staff, in order to make same able to rotate with minimal friction. It is thus understood that the present invention in particular allows a jewel to be treated, which jewel is capable of forming all or part of a bearing of a staff mounted such that it can rotate, such as that shown in FIG. 1.

Figure 2:
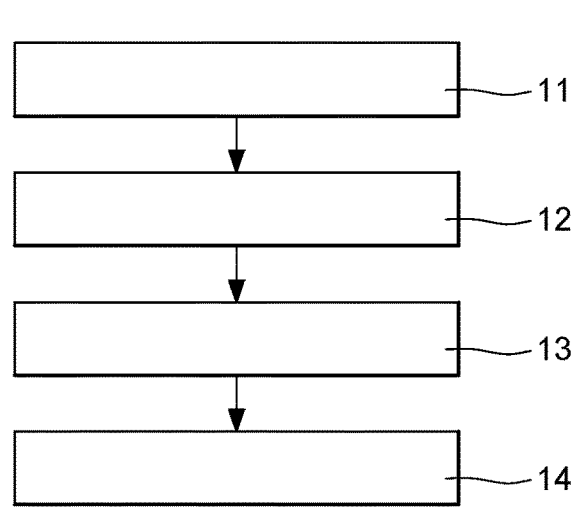
FIG. 2 is a block diagram of a method for producing a jewel according to the invention.

According to the method 10 shown in FIG. 2, the body of the jewel is formed in a first step 11.

For a polycrystalline-type jewel, a precursor is produced from a mixture of at least one powder material with a binder. This material can be, in a non-limiting and non-exhaustive manner, ceramic. In this context, the ceramic-based powder can contain at least a metal oxide, a metal nitride or a metal carbide. For the purposes of illustration, the ceramic-based powder can contain aluminium oxide in order to form synthetic sapphire or a mixture of aluminium oxide and chromium oxide to form poly-ruby of the $Al_2O_3$ type, or zirconium ceramic of the $ZrO_2$ type. Moreover, the binder can have various natures such as, for example, of the polymer or organic type.

A step of pressing the precursor is then carried out with an upper die and a lower die of a pressing device in order to form a green body of the future jewel.

Sintering is then carried out for said green body in order to form the mineral body of the future jewel in said at least one material. The material can be, as stated hereinabove, ceramic. In other words, this step is intended to sinter the green body to form a ceramic body of the future perforated jewel. Preferably, according to the invention, the sintering step can include pyrolysis, for example by thermal debinding.

The mineral body can be machined, for example to shape the top face and bottom face in order to obtain a predefined jewel thickness. Machining can also consist of drilling a hole through the jewel if necessary, and of functionalising the surfaces of the body.

Lapping and/or brushing and/or polishing the mineral body procures a special finish. This finishing step gives the jewel a surface finish that is compatible with the use thereof.

Such a finishing step further allows the final dimensions to be adjusted and/or edges to be removed and/or the surface roughness to be modified locally.

For a monocrystalline jewel, the body is formed using a Verneuil-type method. A Verneuil-type method comprises a step of melting a material that will crystallise upon contact with a single-crystal seed. Corundum ($Al_2O_3$) is typically used as a starting material. Machining and lapping are similar to the embodiment of the polycrystalline-type jewel.

According to the invention, a second step 12 of the method 10 consists of treating at least a part of the surface of the body by ion implantation. Ion implantation is a technology that allows ions to be incorporated into a material.

Thus, it allows for nanostructuring by modifying the relief of the surface of the body. More specifically, the implantation of ions into the surface creates a relief, which modifies the roughness of the surface. Depending on the type of ions implanted, a different roughness is obtained, as the ions have different sizes, which structure the surface differently. Some ions increase the roughness, whereas other ions decrease the roughness of the surface. Increasing the roughness increases the contact angle, whereas decreasing the roughness decreases the contact angle.

Facilities exist for such a treatment, which comprise an ion source, a particle accelerator using electrostatic properties to create a beam of ions and an enclosure containing the body of the jewel to receive the ions.

In a preferred alternative embodiment, the implantation is carried out by immersing the body of the jewel in an ionic plasma. The jewel is submerged into an ion plasma, for example by an ECR-type electron cyclotron resonance method.

A first embodiment of the second step 12 of the method 10 consists of implanting ions on the surface of the jewel, which ions allow the contact angle of a liquid on said surface to be decreased. The contact angle obtained is preferably less than 40° for a drop of water. Thus, such a surface allows the adhesion of a layer deposited on the surface of the body, for example an epilame layer, to be improved. Preferably, the ions implanted on the surface of the jewel are helium or argon ions, as they decrease the contact angle.

In a second embodiment of the second step 12, ions are implanted into the jewel, which ions allow the contact angle of a drop of liquid on the surface of the jewel to be increased. Preferably, the ions implanted on the surface of the jewel are nitrogen ions. The contact angle is greater than 60°, or even greater than 70° for a drop of water. This avoids the need for an epilame layer.

Preferably, the ions are implanted into the body at a depth of up to 150 nm.

A third step 13 of the method 10 is optional depending on the chosen embodiment, and preferably applies to the first embodiment. The third step 13 consists of depositing an epilame layer on the part of the surface treated by ion implantation in the second step. The epilame layer is preferably a chromium nitride layer. An epilame layer is typically deposited in the vapour phase by a PVD- or PECVD-type method. The epilame layer preferably has a thickness of 0.003 to 0.006 μm.

Optionally, laser nanostructuring of the epilame layer can be carried out in a fourth step 14. Thus, it is possible to select which part of the surface of the jewel has an epilame layer.

Figure 3:
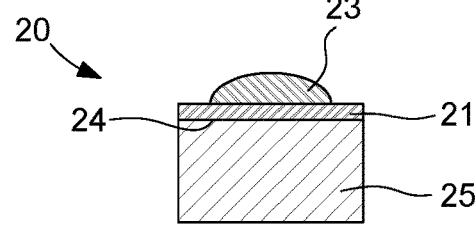
FIG. 3 is a diagrammatic view of a jewel obtained using a first embodiment of the method according to the invention.

The part of the jewel 20, shown in FIG. 3, corresponds to a jewel treated according to the first embodiment. The jewel 20 comprises a body 23, the surface 24 whereof has been implanted with ions that reduce the contact angle of a liquid.

The jewel 20 further includes an epilame layer 21 deposited on this surface 24. As can be seen, a drop of liquid deposited on the epilame layer forms a contact angle greater than 40° for a drop of oil.

Figure 4:
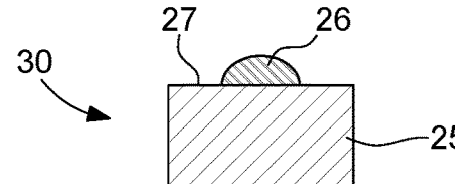
FIG. 4 is a diagrammatic view of a jewel obtained using a second embodiment of the method according to the invention.

The part of the jewel 30, shown in FIG. 4, corresponds to a jewel treated according to the second embodiment. The jewel 30 comprises a body 25, the surface 27 whereof has been implanted with ions that allow the contact angle of a drop of liquid to be increased. This jewel does not require an epilame layer, which is absent in the figure. A drop of water, for example, forms a contact angle of at least 70° thanks to the ion implantation.

The invention claimed is:

1. A method for the surface treatment of a jewel of ceramic, for the watchmaking industry, the jewel comprising a body defining the shape thereof, the method comprising implanting ion directly on the surface of at least a part of said body to modify the roughness of said surface, and to increase the contact angle of a drop of liquid, wherein the implanted ions are nitrogen.

2. The method according to claim 1, further comprising a step of depositing an epilame layer on the surface of the jewel.

3. The method according to claim 2, wherein the epilame layer comprises chromium nitride, and is optionally made entirely thereof.

4. The method according to claim 2, wherein the step of depositing the epilame layer is carried out by physical vapor deposition (PVD) or plasma-enhanced chemical vapor deposition (PECVD).

5. The method according to claim 1, wherein the contact angle is greater than 50°, or greater than 70°, for a drop of water.

6. The method according to claim 1, wherein the ion implantation step is carried out by electron cyclotron resonance (ECR)-type magnetic electron cyclotron resonance.

7. The method according to claim 1, wherein the ion implantation step is carried out using plasma.

8. The method according to claim 1, wherein the body of the jewel is previously formed in a first step by a Verneuil-type method for a monocrystalline jewel or by a sintering method for a polycrystalline jewel.

9. The method according to claim 1, wherein the jewel further comprises $Al_2O_3$ or $ZrO_2$.

* * * * *